(12) United States Patent
Yamaoka et al.

(10) Patent No.: US 7,853,027 B2
(45) Date of Patent: *Dec. 14, 2010

(54) ELECTRET CONDENSER

(75) Inventors: Tohru Yamaoka, Osaka (JP); Hiroshi Ogura, Tokyo (JP); Yuichi Miyoshi, Osaka (JP)

(73) Assignee: Panasonic Corporation, Osaka (JP)

( * ) Notice: Subject to any disclaimer, the term of this patent is extended or adjusted under 35 U.S.C. 154(b) by 387 days.

This patent is subject to a terminal disclaimer.

(21) Appl. No.: 10/591,597

(22) PCT Filed: Feb. 7, 2005

(86) PCT No.: PCT/JP2005/001765

§ 371 (c)(1),
(2), (4) Date: Sep. 5, 2006

(87) PCT Pub. No.: WO2005/086533

PCT Pub. Date: Sep. 15, 2005

(65) Prior Publication Data

US 2007/0189555 A1    Aug. 16, 2007

(30) Foreign Application Priority Data

Mar. 5, 2004  (JP)  .............................. 2004-061987

(51) Int. Cl.
*H04R 25/00* (2006.01)
(52) U.S. Cl. .................. 381/174; 381/175; 381/191
(58) Field of Classification Search .......... 381/113, 381/116, 174, 175, 181, 190, 191, 369; 29/594, 29/25.41, 609.1; 367/170, 181; 73/514.32; 310/311; 257/254, 415; 438/53; 216/2, 216/56

See application file for complete search history.

(56) References Cited

U.S. PATENT DOCUMENTS

| 3,946,422 | A | * | 3/1976 | Yagi et al. ................. 257/254 |
| 4,142,073 | A | | 2/1979 | Agneus et al. |
| 5,452,268 | A | * | 9/1995 | Bernstein .................... 367/181 |
| 5,573,679 | A | * | 11/1996 | Mitchell et al. ................. 216/2 |

(Continued)

FOREIGN PATENT DOCUMENTS

CN  2061748 U  9/1990

(Continued)

OTHER PUBLICATIONS

European Search Report issued in European Patent Application No. EP 04818870.0-1235/1686599 PCT/JP2004/016835, dated Mar. 13, 2009.

(Continued)

*Primary Examiner*—Huyen D Le
(74) *Attorney, Agent, or Firm*—McDermott Will & Emery LLP

(57) ABSTRACT

An electric condenser includes a fixed film 110 including a conductive film 118 to be an upper electrode, a vibrating film 112 including a lower electrode 104 and a silicon oxide film 105 to be an electric film, and a silicon oxide film 108 provided between the fixed film 110 and the vibrating film 112 and including an air gap 109. Respective parts of the fixed film 110 and the vibrating film 112 exposed in the air gap 109 are formed of silicon nitride films 106 and 114.

24 Claims, 5 Drawing Sheets

U.S. PATENT DOCUMENTS

| | | | |
|---|---|---|---|
| 6,622,368 B1 * | 9/2003 | Mullenborn et al. | 29/594 |
| 6,738,484 B2 | 5/2004 | Nakabayashi | |
| 6,870,937 B1 | 3/2005 | Hirosaki et al. | |
| 6,928,178 B2 * | 8/2005 | Chang | 381/191 |
| 7,039,202 B1 | 5/2006 | Takeuchi | |
| 7,386,136 B2 * | 6/2008 | Ohbayashi et al. | 381/174 |
| 2002/0172382 A1 | 11/2002 | Nakabayashi | |
| 2002/0181725 A1 | 12/2002 | Johannsen et al. | |
| 2006/0145570 A1 | 7/2006 | Ohbayashi et al. | |
| 2007/0029894 A1 * | 2/2007 | Yamaoka et al. | 310/311 |

FOREIGN PATENT DOCUMENTS

| | | |
|---|---|---|
| CN | 2279929 Y | 4/1998 |
| CN | 1299152 A | 6/2001 |
| EP | 1 100 289 A2 | 5/2001 |
| JP | 09-283373 | 10/1997 |
| JP | 2001-231098 | 8/2001 |
| JP | 2001-231099 | 8/2001 |
| JP | 2002-27595 | 1/2002 |
| JP | 2002-033241 | 1/2002 |
| JP | 2002-518913 | 6/2002 |
| JP | 2002-209298 | 7/2002 |
| JP | 2002-320294 | 10/2002 |
| JP | 2002-335599 | 11/2002 |
| JP | 2002-345088 | 11/2002 |
| JP | 2003-031820 | 1/2003 |
| JP | 2003-223499 | 8/2003 |
| JP | 2004-166262 | 6/2004 |
| JP | 2004-356707 | 12/2004 |
| WO | WO 99/65277 | 12/1999 |
| WO | WO 02/37893 A1 | 5/2002 |
| WO | WO 2005/050680 A1 | 6/2005 |

OTHER PUBLICATIONS

United States Office Action issued in U.S. Appl. No. 10/591,456, dated Jan. 29, 2009.

United States Office Action issued in U.S. Appl. No. 10/576,518, dated Mar. 2, 2009.

T. Majamaa et al., "Effect of Oxidation Temperature of the Electrical Characteristics of Ultrathin Silicon Dioxide Layers Plasma Oxidized in Ultrahigh Vacuum," Physica Scripta, vol. T79, pp. 259-262, 1999.

E.C. Ross et al., "Effects of Silicon Nitride Growth Temperature on Charge Storage in the MNOS Structure," Applied Physics Letters, 1969, vol. 15, No. 12, pp. 408-409.

Chinese Office Action, with English translation, issued in Chinese Patent Application No. 200480034059.7, mailed Jun. 19, 2009.

United States Office Action issued in U.S. Appl. No. 10/591,456, mailed Jan. 19, 2010.

European Search Report issued in European Patent Application No. EP 05709817.0 dated Jun. 28, 2010.

* cited by examiner

ELECTRET CONDENSER

RELATED APPLICATION

This application is a national phase of PCT/JP2005/001765 filed on Feb. 7, 2005, which claims priority from Japanese Application No. 2004-061987 filed Mar. 5, 2004, the disclosures of which Applications are incorporated by reference herein. The benefit of the filing and priority dates of the International and Japanese Applications is respectfully requested.

TECHNICAL FIELD

The present invention relates to an electric condenser including a vibrating electrode and a fixed electrode, and more particularly relates to an electric condenser formed using a MEMS (Micro Electro mechanical Systems) technology.

BACKGROUND ART

Conventionally, in electric condensers, which are usually applied to elements for condenser microphones and the like, a structure is employed which includes an electric film as dielectrics having a permanent electric polarization and an air gap (cavity) layer between a fixed electrode and a movable electrode which compose a parallel-plate condenser.

In such electric condensers, the thickness of the air gap layer has a direct relationship with a capacitance value of the condenser and involves significant influence on performance of the microphone and the like. Specifically, as the air gap layer is thin, the sensitivity of the microphone or the like increases. In contrast, when variation in thickness of the air gap layer in the manufacturing process is large, variation in sensitivity increases in the microphone and the like. Accordingly, the air gap layer provided in the electric condenser is desired to be thin and has less variation in thickness in the manufacturing process.

In recent years, in order to reduce the thickness of the air gap layer and variation in the thickness thereof in the manufacturing process, a structure of an air gap layer and a method for manufacturing it which utilize a microfabrication technology have been proposed. Specifically, for example, a technique has been proposed in which part of a Si (silicon) substrate is removed by wet etching using potassium hydroxide to form a recess (see Patent Document 1).

Patent Document 1: Japanese Patent Application Laid Open Publication No. 200-345088 A.

DISCLOSURE OF INVENTION

Problems That the Invention is to Solve

However, in order to realize small-size and high-performance appliances in a recent tendency, smaller-size and higher-performance electric condensers are desired of which characteristic variation is small.

Under the circumstances, formation of an electric condenser including a fixed electrode and a movable electrode is being tried with the use of the MEMS technology. However, this presents a problem that in forming an air gap between the fixed electrode and the movable electrode by wet etching, the fixed electrode and the movable electrode stick to each other by surface tension of an etching solvent or a cleaning solvent, that is, a problem that an air gap layer of a desired thickness cannot be formed.

The present invention has been made in view of the foregoing and has its object of preventing electrodes from sticking to each other in forming an air gap in an electric condenser to control the thickness of an air gap layer with high precision.

Means for Solving the Problems

To attain the above object, an electric condenser of the present invention includes: a first film including a first electrode; a second film including a second electrode and an electric film; a first insulting film formed between the first film and the second film; and an air gap formed by removing part of the first insulating film, wherein respective parts of the first film and the second film exposed in the air gap are formed of a second insulating film.

The present invention renders it possible to implement a highly-reliable, small-size, and high-performance microphone. It becomes further possible to widely supply various practical devices equipped with the microphone to the public.

BRIEF DESCRIPTION OF THE DRAWINGS

FIG. 1(a) and FIG. 1(b) are constitutional diagrams of an electric condenser microphone (hereinafter referred to as ECM) according to one embodiment of the present invention, wherein FIG. 1(a) is a plan view of the ECM, and FIG. 1(b) is a section of the ECM.

18 electric condenser
    19 SMD
    20 FET portion
    21 printed circuit board
    22 case for ECM
    23 internal circuit of ECM
    24 output terminal
    25 output terminal
    26 external terminal
    27 external terminal
    28 terminal
    29 terminal
    30 terminal
    101 semiconductor substrate
    102 silicon oxide film
    103 silicon nitride film
    104 lower electrode
    105 silicon oxide film
    106 silicon nitride film
    107 leak hole
    108 silicon oxide film
    109 air gap
    110 fixed film
    111 acoustic hole
    112 vibrating film
    113 membrane region
    114 silicon nitride film
    115 lead wire
    116 opening 117 opening
118 conductive film
119 silicon nitride film

BEST MODE FOR CARRYING OUT THE INVENTION

An electric condenser according to one embodiment of the present invention will by referring to a case applying it to an ECM as an example with reference to the accompanying drawings.

First, the ECM as an element employing the electric condenser of the present embodiment will be described.

Figure 1:
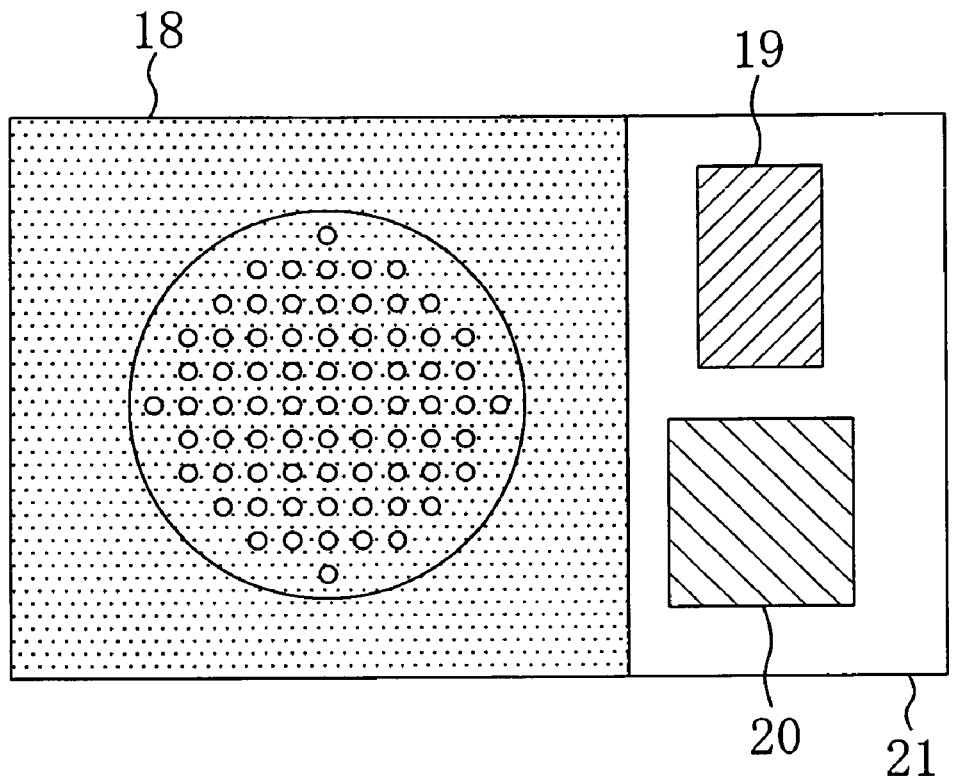
Figure 1:
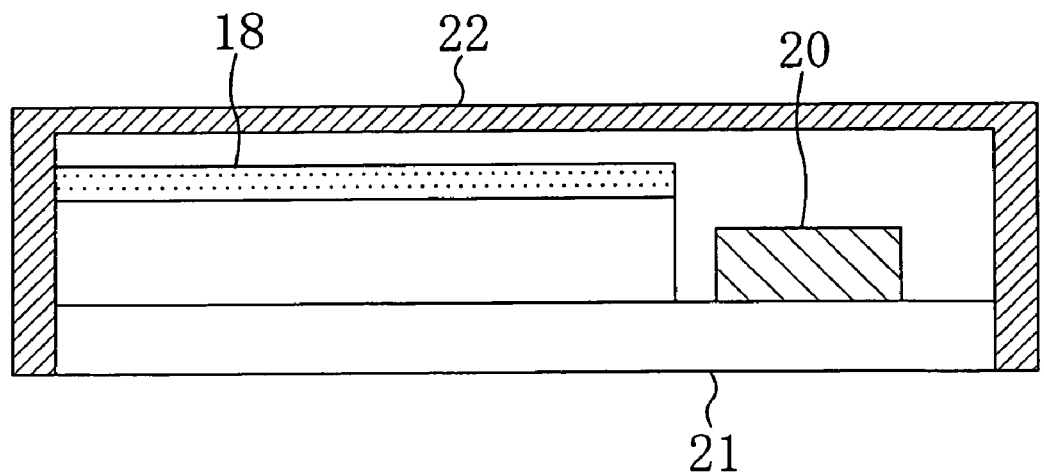

FIG. 1(a) and FIG. 1(b) are constitutional diagrams of the ECM according to the present embodiment, wherein FIG. 1(a) is a plan view of the ECM, and FIG. 1(b) is a section of the ECM.

As shown in FIG. 1(a) and FIG. 1(b), the ECM of the present embodiment is so composed that an electric condenser 18, an SMD (surface mounting device) 19, such as a condenser, and an FET (filed effect transistor) portion 20 are mounted on a printed circuit board 21. Though not shown in FIG. 1(a), the printed circuit board 21 on which the electric condenser 18, the SMD 19, and the FET portion 20 are mounted is protected with a case 22.

Figure 2:
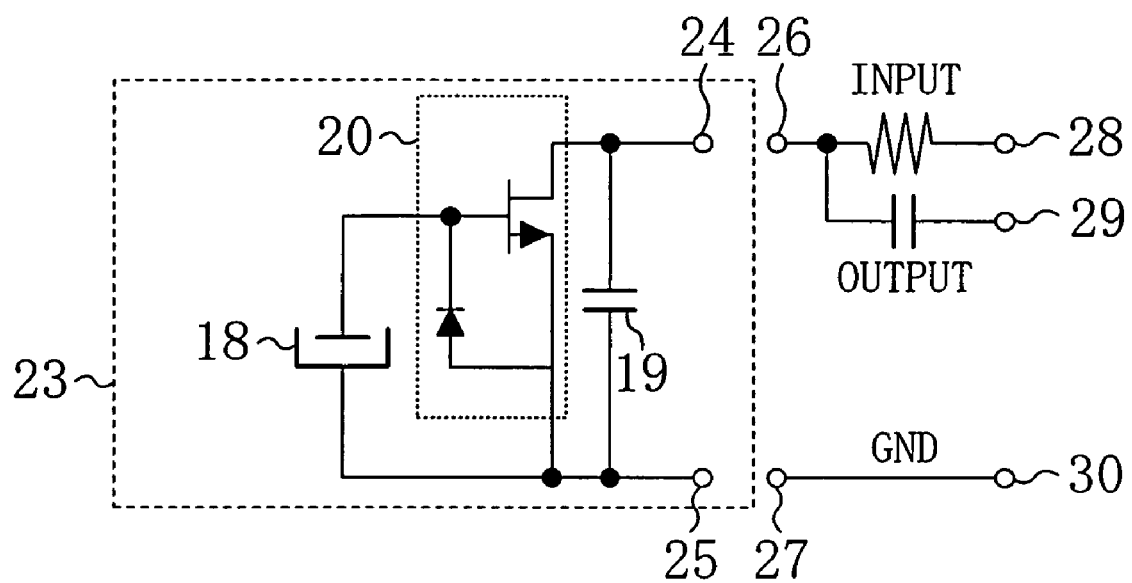
FIG. 2 is a circuit block diagram of the ECM according to the of the present invention.

FIG. 2 is a circuit block diagram of the ECM of the present embodiment.

As shown in FIG. 2, an internal circuit 23 of the ECM of the present embodiment includes the electric condenser 18, which is the electric condenser of the present embodiment as will be described later, the SMD 19, and the FET portion 20. Signals are output from an output terminal 24 and an output terminal 25 of the internal circuit 23 to an external terminal 26 and an external terminal 27, respectively. In an actual operation, when a signal at a voltage of, for example, approximately 2 V is input from a terminal 28 connected to the external terminal 26 via a resistor, a singal having an AC voltage of, for example, several tens of microvolts is output to a terminal 29 connected to the external terminal 26 via a condenser. The external terminal 27 and a terminal 30 connected thereto are connected to the output terminal 25 serving as a GND terminal in the internal circuit 23 of the ECM.

Figure 3:
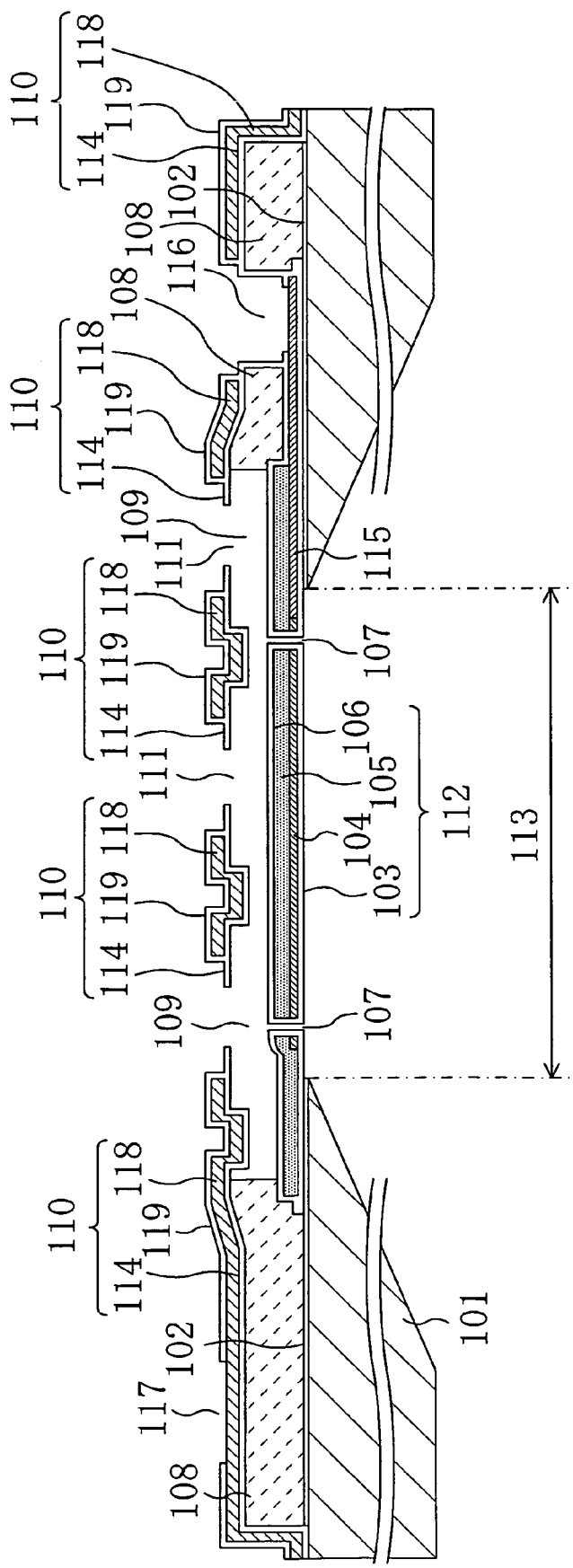
FIG. 3 is a section of an electric condenser composing the ECM according to the embodiment of the present invention.

The electric condenser of the present embodiment will be described below. FIG. 3 is a section of the electric condenser of the present embodiment.

As shown in FIG. 3, the electric condenser of the present embodiment is a parallel plate condenser which includes, on a semiconductor substrate 101 having a region (hereinafter referred to as a membrane region 113) removed to leave the peripheral part thereof, a vibrating film 112 formed so as to cover the membrane region 113 and a fixed film 110 arranged above the vibrating film 112 as electrodes with an air gap 109 interposed therebetween. The vibrating film 112 includes a lower electrode 104 while the fixed film 110 includes a conductive film (upper electrode) 118.

Specifically, a silicon oxide film 102 is formed on the semiconductor substrate 101 on which the electric condenser of the present embodiment is mounted, and the membrane region 113 is formed in such a manner that the semiconductor substrate 101 and the silicon oxide film 102 are removed partially so that the respective peripheral parts thereof are left. In other words, the membrane region 113 is a region formed by partially removing the semiconductor substrate 101 so as to leave the peripheral part thereof for allowing the vibrating film 112 to vibrate upon receipt of pressure from outside.

A silicon nitride film 103 is formed on the silicon oxide film 102 so as to cover the membrane region 113. On the silicon nitride film 103, a lower electrode 104 and a lead wire 115 are formed which are made of the same conductive film. The lower electrode 104 is formed on the silicon nitride film 103 covering the membrane region 103 and a surrounding region thereof (part of an external region of the membrane region 113) while the lead wire 115 is formed so as to be in contact with the lower electrode 104 on part of the silicon nitride film 103 located outside the membrane region 113.

On each of the silicon nitride film 103, the lower electrode 104, and the lead wire 115, a silicon oxide film 105 and a silicon nitride film 106 are formed in this order. Thus, the vibrating film 112 is formed of the silicon nitride film 103, the lower electrode 104 made of the conductive film, the silicon oxide film 105, and the silicon nitride film 106 which are located within the membrane region 113. In the vibrating film 112, a plurality of leak holes 107 are formed to communicate with the air gap 109. The silicon nitride film 103 and the silicon nitride film 106 are formed so as to cover the entire surfaces of the lower electrode 104 and the silicon oxide film 105 including the inner wall faces of the leak holes 107. The silicon oxide film 105 is an electric film that accumulates charge.

Further, as shown in FIG. 3, the fixed film 110, which is formed of the conductive film 118 covered with the lower layer of a silicon nitride film 114 and the upper layer of a silicon nitride film 119, is provided above the vibrating film 112, that is, above the silicon nitride film 106. The air gap 109 is formed between the vibrating film 112 and the fixed film 110 in the membrane region 113 and the surrounding region thereof (part of an external region of the membrane region 113). In the other region, the silicon oxide film 108 is formed between the silicon nitride film 106 or the silicon oxide film 102 and the fixed film 110. In other words, the air gap 109 is formed above a region including at least the entirety of the membrane region 113 while the fixed film 110 is supported above the vibrating film 112 by the silicon oxide film 108. The air gap 109 is formed by partially removing the silicon oxide film 108 formed on the semiconductor substrate 101 and the membrane region 113.

In sum, as a significant feature of the present embodiment, respective parts of the fixed film 110 and the vibrating film 112 which are exposed in the air gap 109 are formed of the silicon nitride films (the silicon nitride film 114 of the fixed film 110 and the silicon nitride film 106 of the vibrating film 112, respectively), as shown in FIG. 3.

A plurality of acoustic holes 111 communicating with the air gap 109 are formed in the fixed film 110 located above the air gap 109. Also, an opening 116 is formed in the silicon oxide film 108 and the fixed film 110 including the silicon nitride film 114, so as to partially expose the lead wire 115. The lower electrode 104 is electrically connected to a gate of the FET portion 20 shown in FIG. 2 via the lead wire 115. Further, an opening 117 is formed in the silicon nitride film 119 composing the fixed film 110 so that the conductive film 118 composing the fixed film 110 is exposed therethrough, whereby the conductive film 118 is electrically connected to the GND terminal 25 in FIG. 2.

Figure 4:
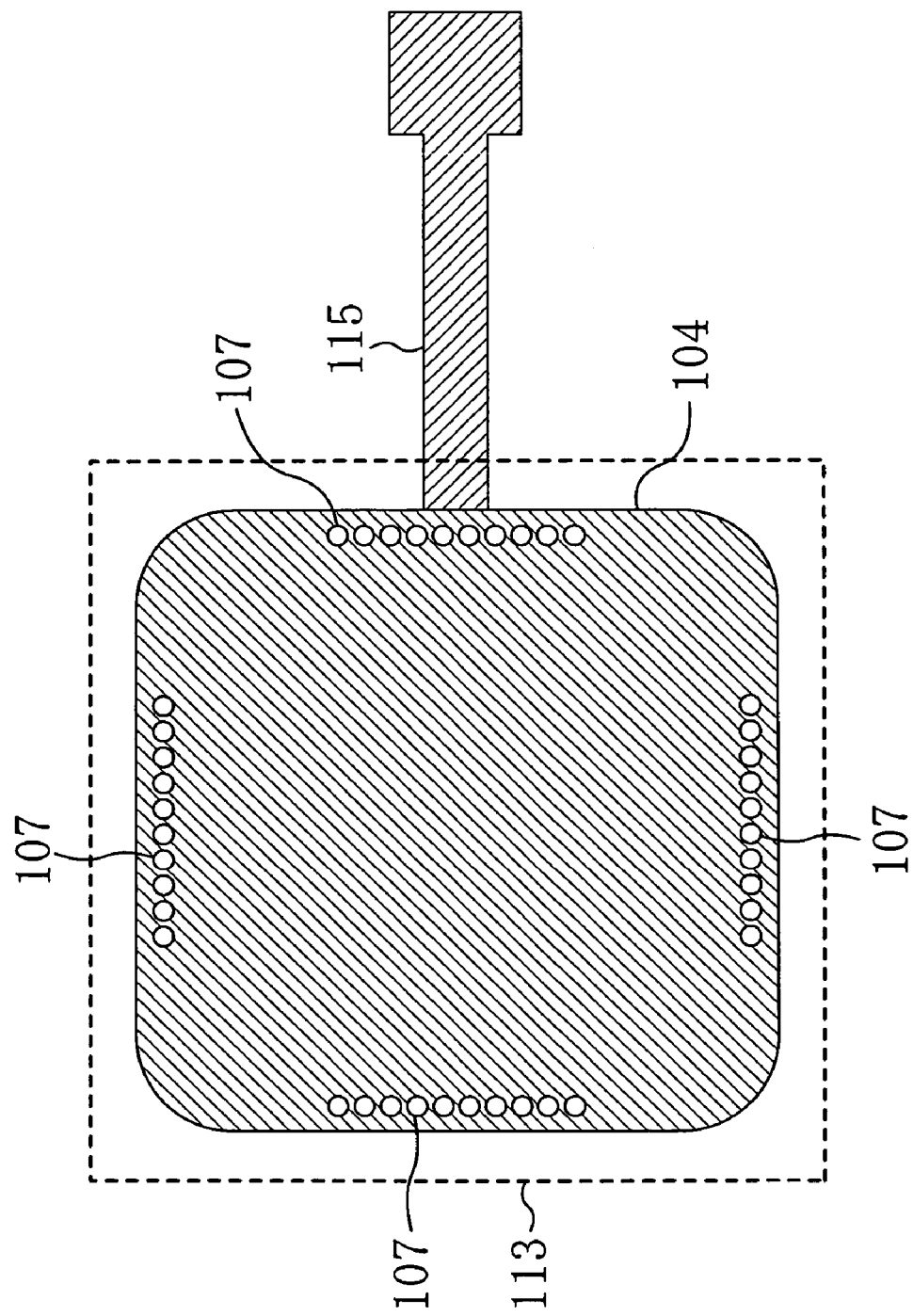
FIG. 4 is a plan view showing a lower electrode and a lead wire of the electric condenser composing the ECM according to the embodiment of the present invention.

FIG. 4 is a plan view showing the lower electrode 104 and the lead wire 115 of the electric condenser in the present embodiment. As described above, the lower electrode 104 and the lead wire 115 are formed of the same conductive film. Further, as shown in FIG. 4, the lower electrode 104 is formed within the membrane region 103, and the plurality of leak holes 107 are formed in the peripheral part of the lower electrode 104. The lead wire 115 is formed for electrically connecting the lower electrode 104 to the outside.

The reason why the lower electrode 104 is formed within the membrane region 113 will be described below. The capacitance of the condenser in the ECM depends on a capacitance component that varies with the vibration of the vibrating film and a capacitance component that does not vary with the vibration of the vibrating film. When a parasitic capacitance is increased, the capacitance component that does not vary with the vibration of the vibrating film increases disadvantageously, so that the performance of the ECM is largely influence thereby. In contrast, in the present embodiment, the lower electrode 104 of the electric condenser is provided within the membrane region 113. This eliminates a region where the lower electrode 104 overlaps the semiconductor substrate 101, eliminating a MOS (Metal Oxide Semiconductor) capacitance of a large area composed of the lower electrode 104, the silicon oxide film 102, and the semiconductor substrate 101. More specifically, the parasitic capacitance is limited only to a MOS capacitor of a small area composed of the lead wire 115, the silicon oxide film 102, and the semiconductor substrate 101. Consequently, the capacitance component (parasitic capacitance) that does not vary in the condenser is prevented from increasing, attaining a small-size and high-performance electric condenser.

Further, in the present embodiment, of the constitutional elements of the vibrating film 112, namely, of the silicon nitride film 103, the lower electrode 104 formed of the conductive film, the silicon oxide film 105, and the silicon nitride film 106, the silicon nitride film 103, the silicon oxide film 105, and the silicon nitride film 106 which cover the membrane region 113 overlap the semiconductor substrate 101. In other words, each edge of the silicon nitride film 103, the silicon oxide film 105, and the silicon nitride film 106 is located on the semiconductor substrate 101. On the other hand, the lower electrode 104 formed of the conductive film in the vibrating film 112 is formed within the membrane region 113 so as not to overlap the semiconductor substrate 101. In short, the edge of the lower electrode 104 is located within the membrane region 113. This enables control of the resonance frequency characteristic of the vibrating film 112 by adjusting each thickness of the silicon nitride film 103, the silicon oxide film 105, and the silicon oxide film 106. In other words, the capacitance component that varies upon receipt of pressure from outside in the condenser can be controlled easily, attaining a small-size and highly-sensitive electric condenser.

A description will be given below to the reason why the silicon nitride film 103 and the silicon nitride film 106 are formed so as to cover the lower electrode 104 and the silicon oxide film 105. When an electric formed of a silicon oxide film comes in contact with a liquid, the charge in the electric is reduced significantly. In the present embodiment, in order to control such reduction in charge of the electric, at least the surfaces (the upper surface, the lower surface, and the side surface) of the silicon oxide film 105 serving as the electric are covered with the silicon nitride film 103 and the silicon nitride film 106. In detail, the silicon nitride film 106 covers completely even the inner wall faces of the leak holes 107 formed in the vibrating film 112 so as not to expose the silicon oxide film (electric) 105 in the leak holes 107. This realizes an electric condenser excellent in moisture resistance and thermal resistance.

Figure 5:
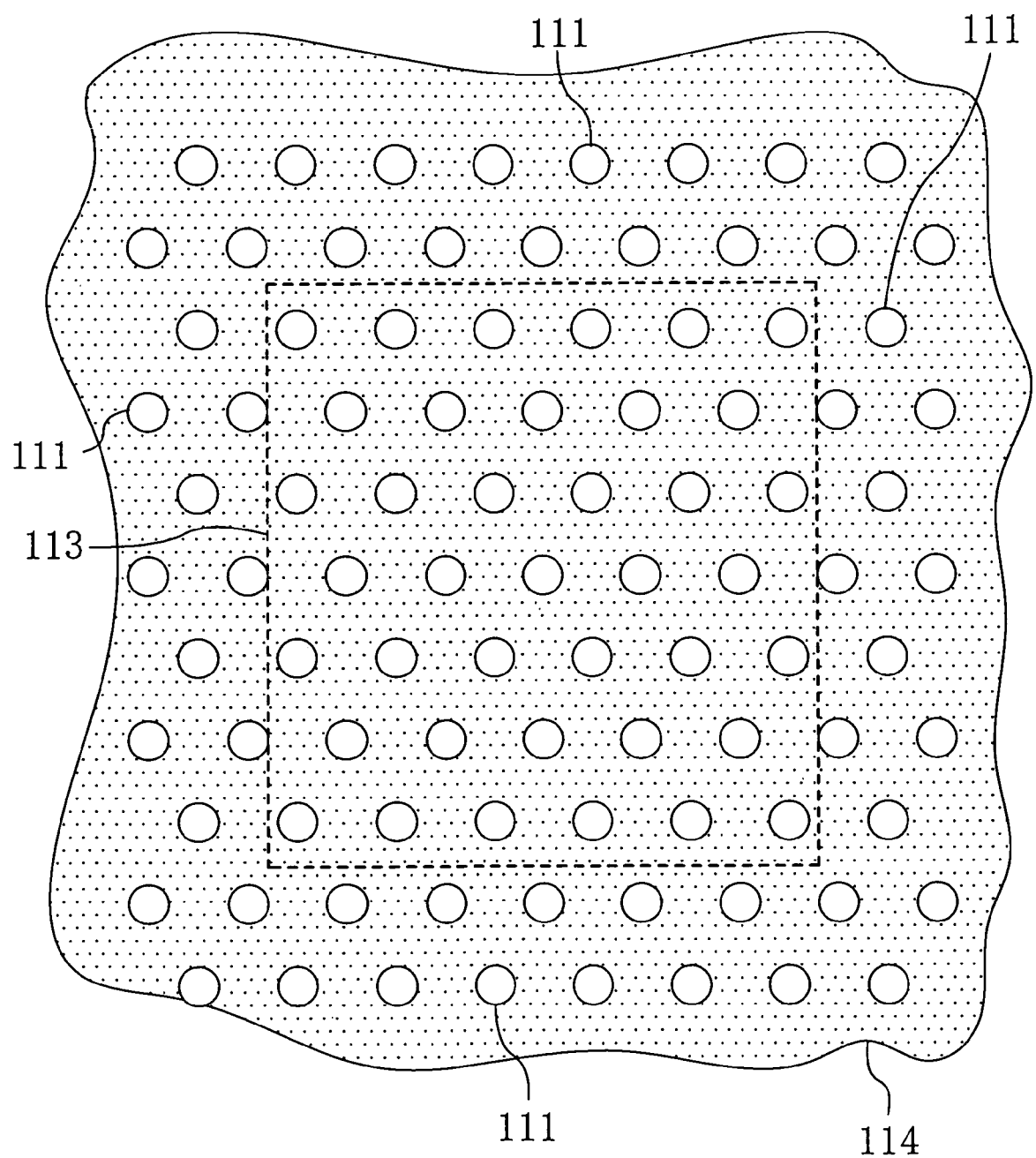
FIG. 5 is a plan view of a silicon nitride film in a fixed film of the electric condenser composing the ECM according to the embodiment of the present invention.

FIG. 5 is a plan view of the silicon nitride film 114 composing the fixed film 110 in the electric condenser of the present embodiment. As described above, the plurality of acoustic holes 111 are formed in the fixed film 110 formed above the semiconductor substrate 101 and the membrane region 113. The acoustic holes 111 are arranged in the membrane region 113 and the surrounding region thereof (part of an external region of the membrane region 113).

An operation of the electric condenser of the present embodiment will be described below. In the electric condenser of the present embodiment shown in FIG. 3, upon receipt of sound pressure from above through the acoustic holes 111 and the air gap 109, the vibrating film 112 vibrates up and down mechanically in response to the sound pressure. The electric condenser of the present embodiment is a parallel-plate condenser which uses the lower electrode 104 of the vibrating film 112 and the conductive film 118 of the fixed film 110 as electrodes. Accordingly, vibration of the vibrating film 112 changes the distance between the lower electrode 104 and the conductive film 118 to change the capacitance (C) of the condenser. The charge (Q) capable of being accumulated in the condenser is fixed, and therefore, change in capacitance (C) of the condenser causes the voltage (V) between the lower electrode 104 and the fixed film 110 (the conductive film 118) to change. The reason for this is that the condition given by the following expression (1) must be satisfied physically.

$$Q=C \cdot V \tag{1}$$

Further, since the lower electrode 104 is electrically connected to the gate of the FET portion 20 in FIG. 2, change in voltage (V) between the lower electrode 104 and the fixed film 110 (the conductive film 118) changes the gate potential of the FET portion 20. Thus, the gate potential of the FET portion 20 changes in response to the vibration of the vibrating film 112, and the change in gate potential of the FET portion 20 is output to the external output terminal 29 in FIG. 2 as a voltage change.

Incidentally, large variation in capacitance of a condenser in an air gap formation region of the ECM causes significant influence on the performance of the ECM.

In contrast, in the present embodiment, respective parts of the fixed film 110 and the vibrating film 112 exposed in the air gap 109 are formed of the insulating films, specifically, the silicon nitride films (the silicon nitride film 114 and the silicon nitride film 106), which have tensile stress. In other words, the silicon nitride films cover the upper surface and the lower side of the silicon oxide film 108 in which the air gap 109 is formed. This prevents the vibrating film 112 and the fixed film 110 from sticking to each other by surface tension in forming the air gap 109. Accordingly, the thickness of the air gap 109, which determines the capacitance of the condenser in the region where the air gap 109 is to be formed, can be determined according to the film thickness of a thin film (the silicon oxide film 108 in the present embodiment) formed by a semiconductor microfabrication technique or the like, so that the air gap 109 can have a desired thickness. This attains a smaller-size and higher-performance electric condenser with less characteristic variation.

Hence, according to the present embodiment, a highly-reliable, small-size, and high-performance microphone can be contemplated. Further, various practical devices equipped with the microphone can be supplied widely to the public.

It should be noted that the silicon nitride films (the silicon nitride films 106 and 114) are used at the respective parts of the fixed film 110 and the vibrating film 112 exposed in the air gap 109, but any other kind of insulating films may be used only if it has tensile stress.

Further, in the present embodiment, any of silicon or polysilicon doped with an impurity, gold, refractory metal, aluminum, and aluminum-containing alloy, and the like may be used as a conductive material of the lower electrode 104.

As well, in the present embodiment, any of silicon or polysilicon doped with an impurity, gold, refractory metal, aluminum, and aluminum-containing alloy, and the like may be used as a material of the conductive film 118 composing the fixed film 110.

Moreover, in the present embodiment, a substrate made of an insulating material may be used rather than the semiconductor substrate 101.

In addition, in the present embodiment, the silicon oxide film 108 is used as an insulting film (sacrificial layer) for forming the air gap 109 but the kind of the sacrificial layer is not limited especially. Also, the sacrificial layer may be a lamination layer of a plurality of insulating films made of the same material. This minimizes variation in thickness of the sacrificial layer, in turn, minimizes variation in thickness of the air gap, compared with a case using as the sacrificial layer a single-layer insulating film having the same thickness, with a result of further minimization of characteristic variation of the electric condenser.

INDUSTRIAL APPLICABILITY

The present invention relates to an electric condenser including a vibrating electrode and a fixed electrode. When applied to an ECM or the like formed using a MEMS technology, the present invention can realize a high-performance and highly-reliable ECM, and therefore, is very useful.

The invention claimed is:

1. An MEMS device, comprising:
a first film including a first electrode having a lower surface on which a first insulating film is formed;
a second film including a second electrode having an upper surface on which a second insulating film is formed; and
an air gap formed between the first film and the second film,
wherein the lower surface of the first electrode faces the upper surface of the second electrode, and
the air gap is formed by removing a sacrificial film formed between the first film and the second film.

2. The MEMS device of claim 1,
wherein at least one of the first electrode and the second electrode has a through hole communicating with the air gap.

3. The MEMS device of claim 1,
wherein the first insulating film and the second insulating film are insulating films having tensile stress.

4. The MEMS device of claim 1,
wherein the first insulating film and the second insulating film are silicon nitride films.

5. The MEMS device of claim 1,
wherein the sacrificial film is a lamination layer of a plurality of insulating films made of the same material.

6. The MEMS device of claim 1,
wherein the first film is a fixed film, and the second film is a vibrating film.

7. The MEMS device of claim 1,
wherein the first insulating film is formed so that the first electrode does not come into contact with the air gap, and
the second insulating film is formed so that the second electrode does not come into contact with the air gap.

8. The MEMS device of claim 1, wherein the thickness of the air gap is determined substantially by the thickness of the sacrificial film.

9. The MEMS device of claim 1,
wherein one of the first film and the second film further includes an electret film.

10. The MEMS device of claim 1,
wherein one of the first film and the second film vibrates upon receipt of sound pressure.

11. The MEMS device of claim 1,
wherein the air gap is formed using a semiconductor microfabrication technique.

12. The MEMS device of claim 1,
wherein the air gap is formed by removing a part of the sacrificial film by wet etching.

13. The MEMS device of claim 1,
wherein a protrusion is formed on one of the first film and the second film, and
the protrusion faces another one of the first film and the second film and extends toward the air gap in a direction perpendicular to the lower surface of the first electrode.

14. The MEMS device of claim 13,
wherein a recess corresponding to the protrusion is formed in the one of the first film and the second film.

15. The MEMS device of claim 1,
wherein the first film is formed on a semiconductor substrate so as to be in contact with the semiconductor substrate.

16. The MEMS device of claim 1,
wherein the first film is formed on a semiconductor substrate so as to be in contact with the semiconductor substrate, and
a through hole is formed in the semiconductor substrate.

17. The MEMS device of claim 1,
wherein the first film is formed on a semiconductor substrate so as to be in contact with the semiconductor substrate, and
a through hole is formed in the semiconductor substrate, where the through hole is formed by removing a part of the semiconductor substrate by wet etching.

18. The MEMS device of claim 1,
wherein the first film is formed on a semiconductor substrate so as to be in contact with the semiconductor substrate,
the semiconductor substrate is placed on a printed circuit board so as to be in contact with the printed circuit board, and
a field effect transistor is formed on the printed circuit board so as to be in contact with the printed circuit board.

19. The MEMS device of claim 1,
wherein a part of the sacrificial film is formed between the first and second films as a supporting portion, and
the air gap is substantially surrounded by the first and second insulating films and the supporting portion.

20. The MEMS device of claim 1, wherein at least one of the first insulating film and the second insulating film entirely covers corresponding one of the lower surface of the first electrode and the upper surface of the second electrode.

21. The MEMS device of claim 1, wherein the first insulating film entirely covers the lower surface of the first electrode, and the second insulating film entirely covers the upper surface of the second electrode.

22. The MEMS device of claim 1, wherein at least one of the first insulating film and the second insulating film entirely and uniformly covers corresponding one of the lower surface of the first electrode and the upper surface of the second electrode.

23. The MEMS device of claim 1, further comprising a substrate having an opening, wherein
    a portion of the lower surface of the first electrode which is located directly above the opening is covered by the first insulating film.

24. The MEMS device of claim 1, wherein:
    the first film is a fixed film, and
    a part of the second film and a part of the second insulating film constitute a vibrating film.

* * * * *

UNITED STATES PATENT AND TRADEMARK OFFICE
CERTIFICATE OF CORRECTION

PATENT NO. : 7,853,027 B2  
APPLICATION NO. : 10/591597  
DATED : December 14, 2010  
INVENTOR(S) : Tohru Yamaoka et al.

Page 1 of 1

It is certified that error appears in the above-identified patent and that said Letters Patent is hereby corrected as shown below:

Title Page;

Specifically, please add the following references to the list of references considered by the Examiner in section (56) References Cited, U.S. Patent Documents:

1. 4,441,038
2. 2002/0081846
3. 200310026443
4. 2002/0180047
5. 2003/0015798
6. 2007/0217635
7. 6,731,766
8. 6,859,542
9. 6,479,878
10. 6,847,090
11. 5,490,220
12. 2003/0.007655
13. 5,677,965
14. 6,586,163
15. 6,383,832
16. 2001/0033670
17. 2004/0114775
18. 2004/0259286
19. 2005/0254673

Signed and Sealed this  
Twenty-second Day of February, 2011

David J. Kappos  
*Director of the United States Patent and Trademark Office*

UNITED STATES PATENT AND TRADEMARK OFFICE
CERTIFICATE OF CORRECTION

| | | |
|---|---|---|
| PATENT NO. | : 7,853,027 B2 | Page 1 of 1 |
| APPLICATION NO. | : 10/591597 | |
| DATED | : December 14, 2010 | |
| INVENTOR(S) | : Tohru Yamaoka et al. | |

It is certified that error appears in the above-identified patent and that said Letters Patent is hereby corrected as shown below:

Title Page;

Specifically, please add the following references to the list of references considered by the Examiner in section (56) References Cited, U.S. Patent Documents:

1. 4,441,038
2. 2002/0081846
3. 2003/0026443
4. 2002/0180047
5. 2003/0015798
6. 2007/0217635
7. 6,731,766
8. 6,859,542
9. 6,479,878
10. 6,847,090
11. 5,490,220
12. 2003/0007655
13. 5,677,965
14. 6,586,163
15. 6,383,832
16. 2001/0033670
17. 2004/0114775
18. 2004/0259286
19. 2005/0254673

This certificate supersedes the Certificate of Correction issued February 22, 2011.

Signed and Sealed this
Twelfth Day of April, 2011

David J. Kappos
*Director of the United States Patent and Trademark Office*